(12) United States Patent
Li et al.

(10) Patent No.: US 12,378,271 B2
(45) Date of Patent: Aug. 5, 2025

(54) PLATINUM METAL COMPLEX AND USE THEREOF IN ORGANIC ELECTROLUMINESCENT DEVICE

(71) Applicant: GUANGDONG AGLAIA OPTOELECTRONIC MATERIALS CO., LTD, Guangdong (CN)

(72) Inventors: Huiyang Li, Foshan (CN); Lei Dai, Foshan (CN); Lifei Cai, Foshan (CN)

(73) Assignee: GUANGDONG AGLAIA OPTOELECTRONIC MATERIALS CO., LTD, Foshan (CN)

( * ) Notice: Subject to any disclaimer, the term of this patent is extended or adjusted under 35 U.S.C. 154(b) by 721 days.

(21) Appl. No.: 17/776,942

(22) PCT Filed: Sep. 19, 2020

(86) PCT No.: PCT/CN2020/116338
§ 371 (c)(1),
(2) Date: May 13, 2022

(87) PCT Pub. No.: WO2021/120742
PCT Pub. Date: Jun. 24, 2021

(65) Prior Publication Data
US 2023/0024427 A1    Jan. 26, 2023

(30) Foreign Application Priority Data
Dec. 16, 2019  (CN) .......................... 201911295834.9

(51) Int. Cl.
*H01L 51/00*     (2006.01)
*C07F 15/00*     (2006.01)
(Continued)

(52) U.S. Cl.
CPC ...... *C07F 15/0086* (2013.01); *C07F 15/0006* (2013.01); *C09K 11/06* (2013.01);
(Continued)

(58) Field of Classification Search
CPC ...... C09K 2211/1007; C09K 2211/185; C09K 2211/1029; C09K 2211/1011; H10K 85/346
See application file for complete search history.

(56) References Cited

U.S. PATENT DOCUMENTS 10,033,003 B2     7/2018  Li
2007/0103060 A1*  5/2007  Itoh ..................... H10K 85/346
                                                          313/504
(Continued)

FOREIGN PATENT DOCUMENTS

CN  106795428 A          5/2017
DE  102009042693 A1 *    3/2011  .......... C07F 15/0086
(Continued)

OTHER PUBLICATIONS

Friel et al. "Aluminum-Catalyzed Asymmetric Alkylations of Pyridyl-Substituted Alkynyl Ketones with Dialkylzinc Reagents" J. Am. Chem. Soc, 2008, 130, 9942 synthesis.

*Primary Examiner* — Michael M Dollinger
(74) *Attorney, Agent, or Firm* — Maschoff Brennan

(57) ABSTRACT

The present invention relates to a platinum metal complex and an application thereof in an organic light-emitting device. The platinum metal complex is a compound having a structure of chemical formula (I). An organic light-emitting device to which the compound is applied has a relatively low driving voltage, a relatively high luminous efficiency and improved service life to a certain extent; therefore, the complex has the potential of being applied in the field of organic light-emitting devices. Also provided is an organic light-emitting device, including a cathode, an anode, and an organic layer. The organic layer is one or more of a hole injection layer, a hole transport layer, a light-emitting layer, a hole blocking layer, an electron transport layer, and an electron injection layer; and at least one layer in the organic layer contains the compound of structural formula (I).

(Continued)

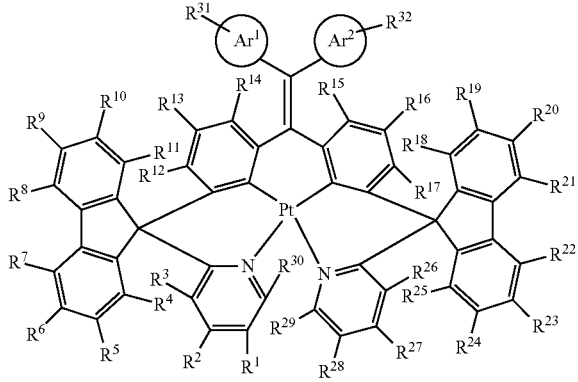

(I)

20 Claims, 1 Drawing Sheet

(51) Int. Cl.
*C09K 11/06* (2006.01)
*H10K 85/30* (2023.01)
*H10K 50/11* (2023.01)
*H10K 102/00* (2023.01)

(52) U.S. Cl.
CPC .... H10K 85/346 (2023.02); *C09K 2211/1007* (2013.01); *C09K 2211/1011* (2013.01); *C09K 2211/1029* (2013.01); *C09K 2211/185* (2013.01); *H10K 50/11* (2023.02); *H10K 2102/351* (2023.02)

(56) References Cited

U.S. PATENT DOCUMENTS

2017/0365799 A1* 12/2017 Ji .................. C07F 15/0033
2018/0212165 A1* 7/2018 Ji ...................... C09K 11/06
2018/0219161 A1* 8/2018 Li ...................... C09K 11/06

FOREIGN PATENT DOCUMENTS

| EP | 3133078 A1 * | 2/2017 | .......... C07F 15/0086 |
| EP | 3366690 A1 | 8/2018 | |
| KR | 102192286 B1 * | 12/2020 | ............. H10K 50/11 |
| WO | WO-2008136805 A2 * | 11/2008 | ......... G01N 33/0057 |
| WO | WO-2010084690 A1 * | 7/2010 | ............ C07F 7/1804 |
| WO | 2019144845 A1 | 8/2019 | |

* cited by examiner

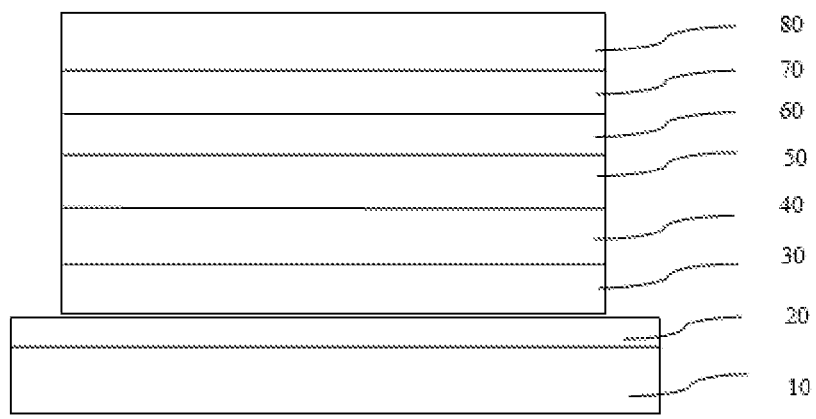

PLATINUM METAL COMPLEX AND USE THEREOF IN ORGANIC ELECTROLUMINESCENT DEVICE

TECHNICAL FIELD

The present invention relates to the field of organic light-emitting materials, and in particular to a platinum metal complex and an application thereof in an organic light-emitting device as a light-emitting material.

BACKGROUND

Organic optoelectronic devices include but not limited to the following types: organic light-emitting devices (OLEDs), organic thin film transistors (OTFTs), organic photovoltaics (OPVs), luminescent electrochemical cells (LECs) and chemical sensors.

In recent years, as a kind of lighting and display technology having great application prospect, OLEDs have been widely concerned in academic circle and industrial circle. OLEDs devices are featured by self-illumination, wide viewing angle, short response time and preparation of flexible devices to be a promising candidate in the next generation of display and lighting technology. But the current OLEDs have the problems such as, low efficiency and short service life and thus, are to further studied by people.

The early-stage fluorescent OLEDs only utilize singlet state for light emission usually; and the triplet exciton produced in the device cannot be effectively utilized and return to the ground state in a non-radiative way, thereby limiting the promotion and use of the OLEDs. In 1998, CHE Chi-Ming, et al. of University of Hong Kong reported the electrophosphorescence phenomenon for the first time. In the same year, Thompson, et al. used a transition metal complex as a light-emitting material to prepare phosphorescent OLEDs. Phosphorescent OLEDs can efficiently utilize singlet state and triplet exciton to emit light to achieve 100% internal quantum efficiency theoretically, which greatly promotes the commercialization process of OLEDs. The control of color emitted by OLEDs can be achieved by the structural design of the light-emitting material. OLEDs may include a light-emitting layer or a plurality of light-emitting layers to achieve the required spectrum. At present, green, yellow and red phosphorescent materials have been put into commercialization. Commercialized OLEDs display achieves full-color display usually by matching blue fluorescence with yellow, or green and red phosphorescence. The rapid decrease of efficiency of phosphorescent OLEDs at high brightness is still a problem to be solved. Currently, the industrial circle is in urgent need of a light-emitting material having higher efficiency and longer service life.

Metal complexes, as light-emitting materials, have been applied in industry; but in the aspect of performance, such as color saturation and service life still need to be further improved. Moreover, the easy luminescent quenching caused by the material under the state of aggregation is also a problem to be solved.

SUMMARY

Directed to the above problems in the prior art, the present invention provides a platinum metal complex light-emitting material; the material is applied in an organic light-emitting device to show good photoelectrical properties and service life. The present invention further provides a light-emitting device, and the device includes the metal complex of the present invention.

A platinum metal complex is a compound having a structure as shown in Formula (I):

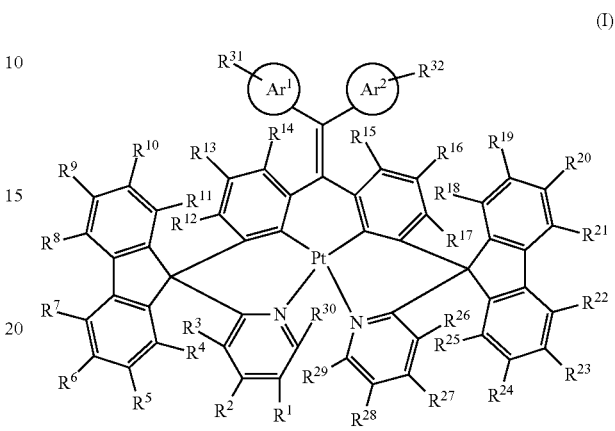

(I)

where:

$R^1$-$R^{32}$ are each independently selected from: hydrogen, deuterium, halogen, substituted or unsubstituted alkyl having 1-20 carbon atoms, substituted or unsubstituted cycloalkyl having 3-20 carbon atoms, substituted or unsubstituted alkoxy having 1-20 carbon atoms, substituted or unsubstituted aryl having 6-30 carbon atoms, substituted or unsubstituted heteroaryl having 3-30 carbon atoms, or cyano; $Ar^1$ and $Ar^2$ are independently selected from an aromatic group having 6-14 carbon atoms and an heteroaromatic group having 3-12 carbon atoms, respectively; heteroatom in the heteroaromatic group is selected from one or more of O, S and N; and the substitution refers to a substitution by deuterium, halogen and C1-8 alkyl.

Preferably, in the general formula (I), the $R^1$-$R^{32}$ are independently selected from: hydrogen, deuterium, halogen, substituted or unsubstituted alkyl having 1-6 carbon atoms, substituted or unsubstituted cycloalkyl having 3-6 carbon atoms, substituted or unsubstituted aryl having 6-12 carbon atoms, substituted or unsubstituted heteroaryl having 3-6 carbon atoms, respectively; the $Ar^1$ and the $Ar^2$ are independently selected from phenyl and pyridine, respectively.

Preferably, in the general formula (I), the $R^1$-$R^{32}$ are independently selected from: hydrogen, deuterium, substituted or unsubstituted alkyl having 1-4 carbon atoms, substituted or unsubstituted cycloalkyl having 3-6 carbon atoms, phenyl, tolyl or pyridyl, respectively;

the $Ar^1$ and the $Ar^2$ are the same.

Further preferably, in the general formula (I), the $R^1$-$R^{32}$ are independently selected from: hydrogen, methyl, isopropyl or tert-butyl, respectively.

Further preferably, in the general formula (I), $R^1$-$R^3$, $R^{12}$-$R^{17}$ and $R^{26}$-$R^{30}$ in the $R^1$-$R^{32}$ are hydrogen; other groups are hydrogen, methyl, isopropyl or tert-butyl; $Ar^1$ and $Ar^2$ are phenyl.

Examples of the platinum metal complex according to the present invention are listed below, hut not limited to the structures listed:

1
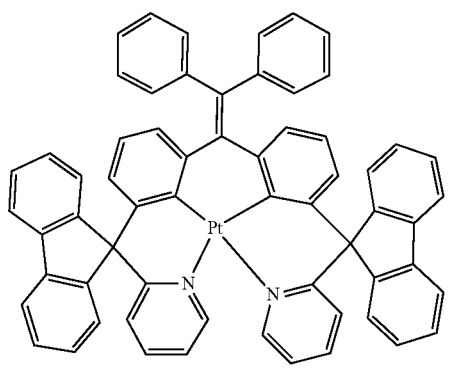
2
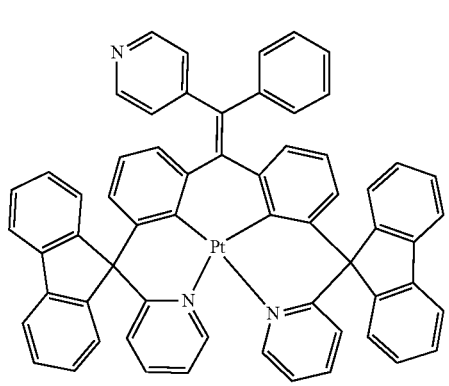
3
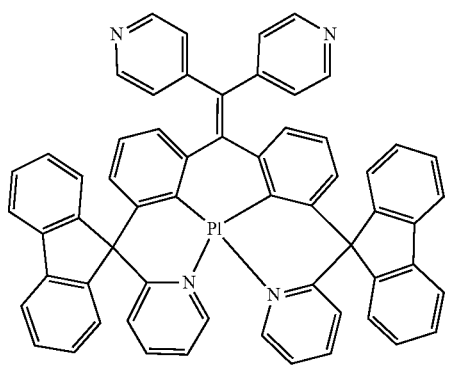
4
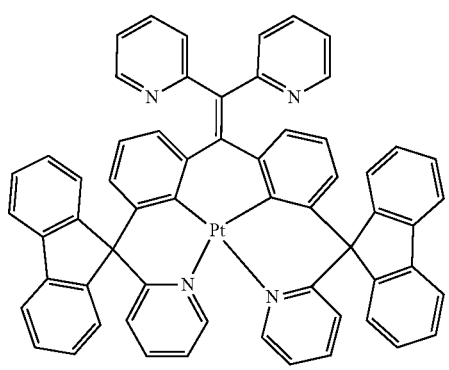
5
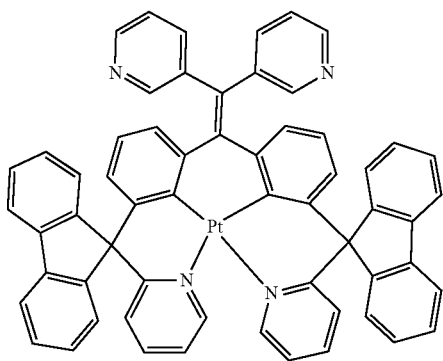
6
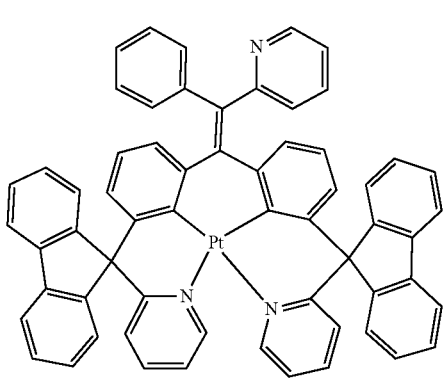
7
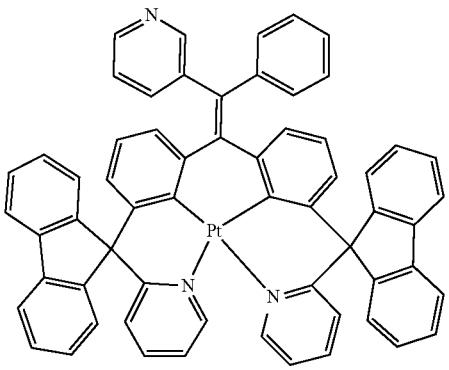
8
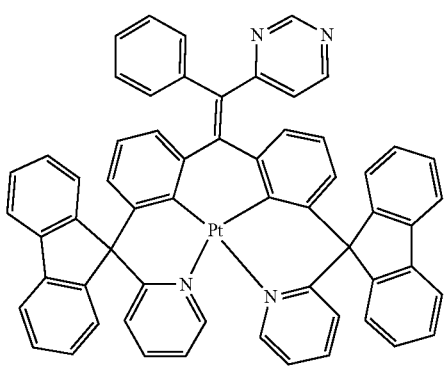

9
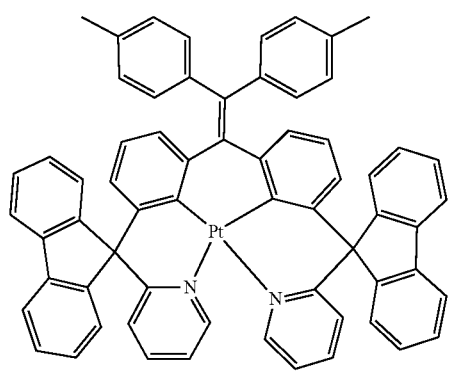
10
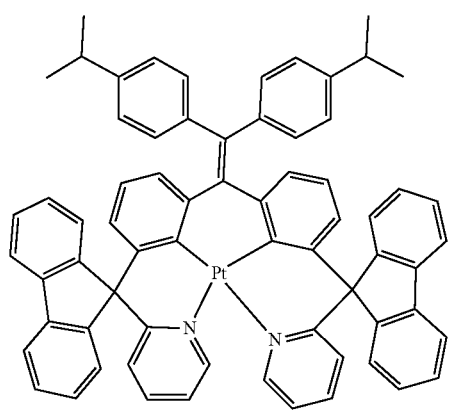
11
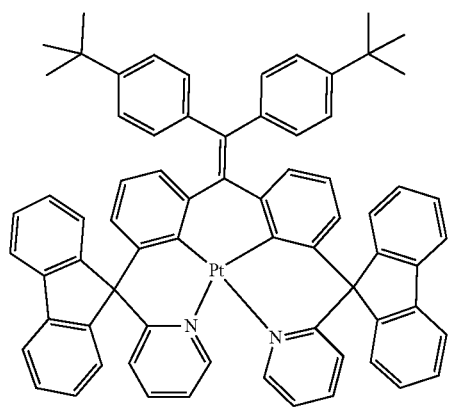
12
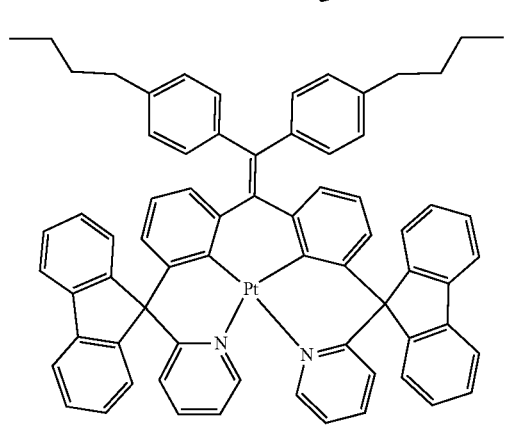
13
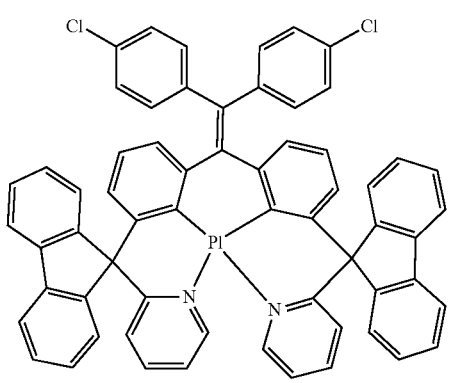
14
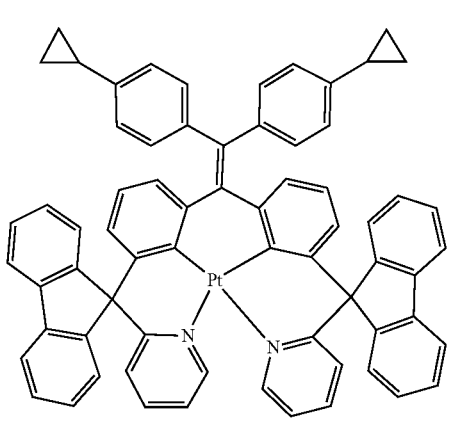
15
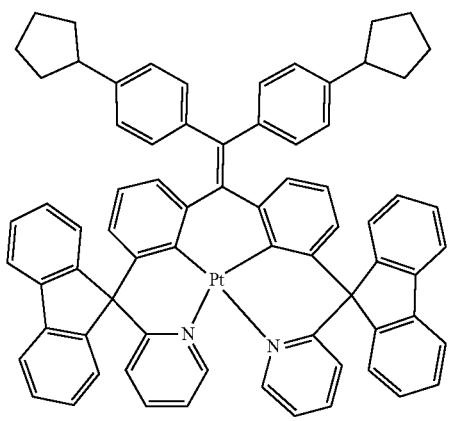
16
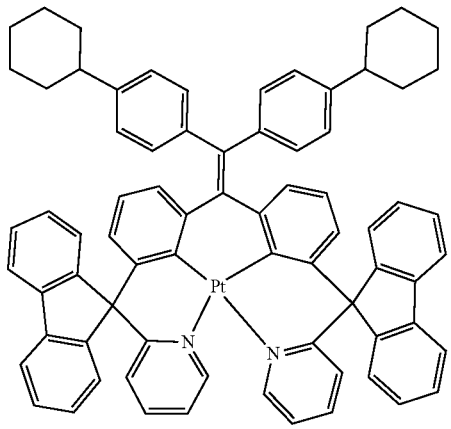

17
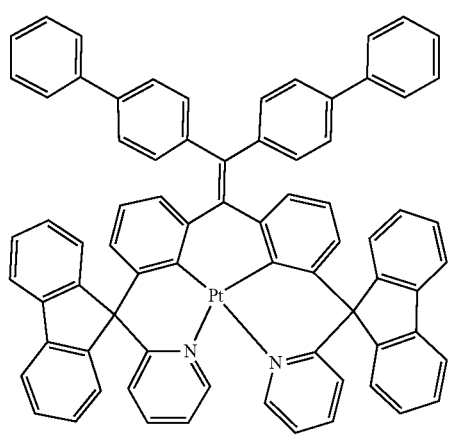
18
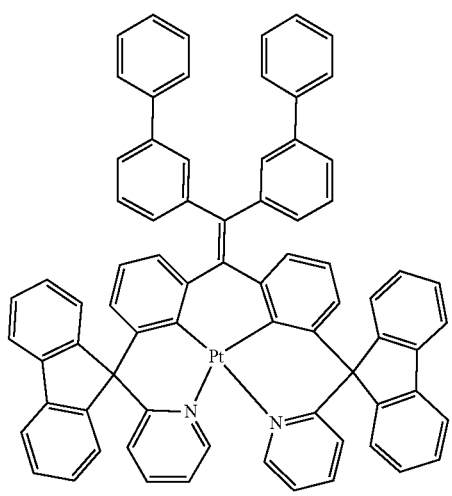
19
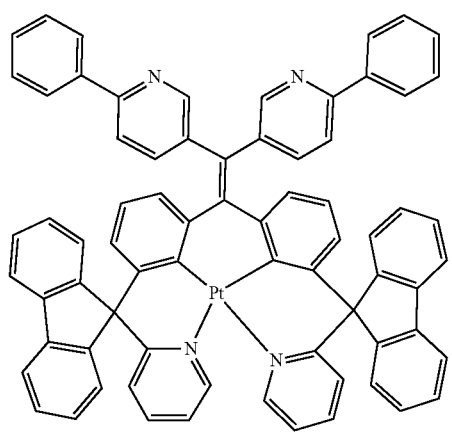
20
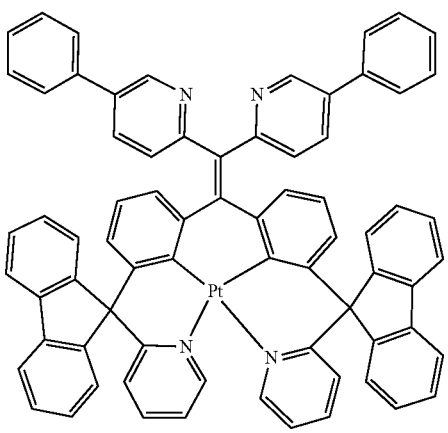
21
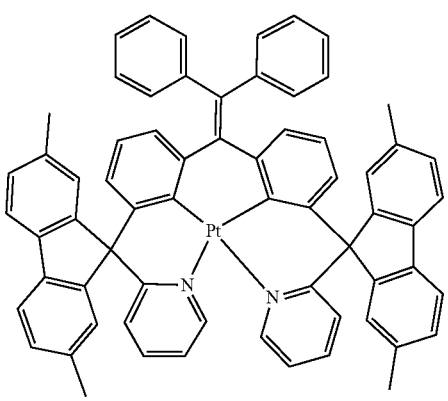
22
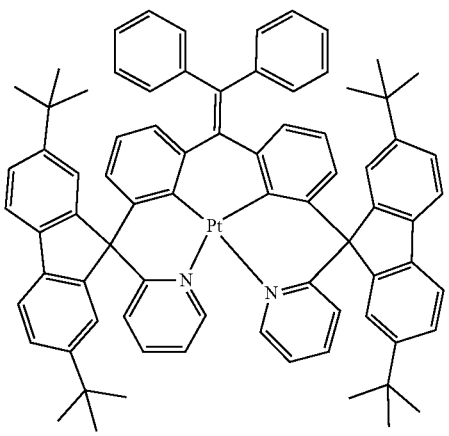

23
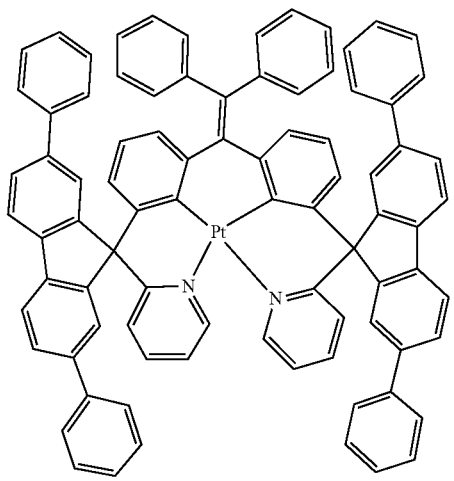
24
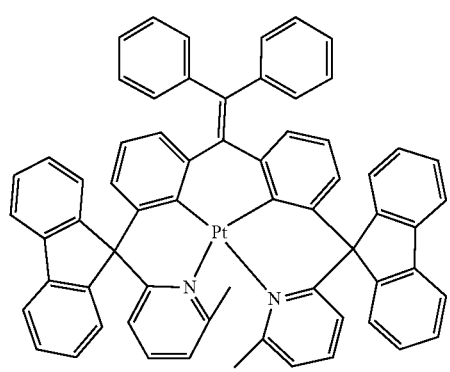
25
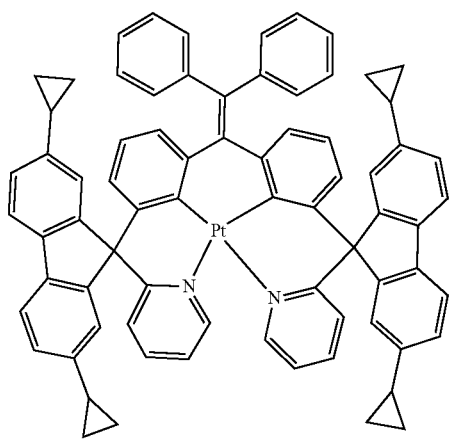
26
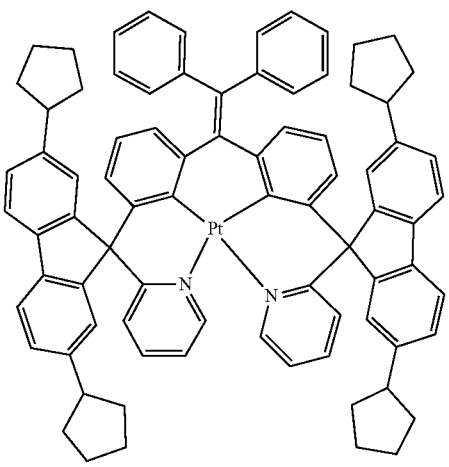
27
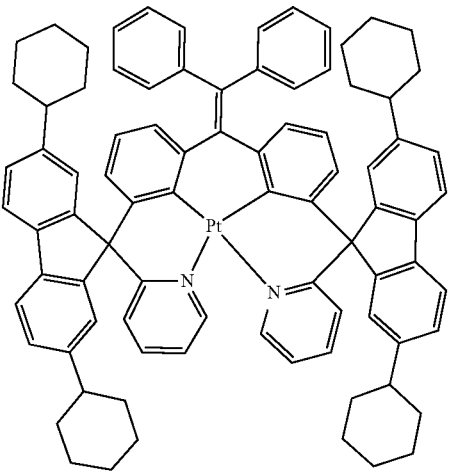
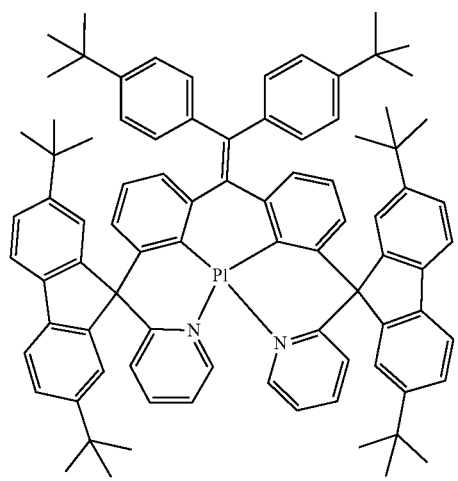

A precursor of the above compound, namely, a ligand, has a structural formula below:

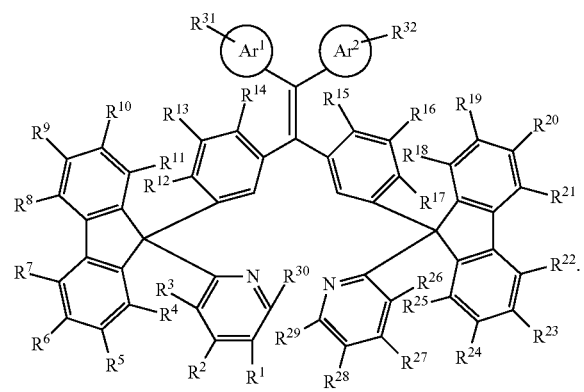

The present invention further provides an application of the above platinum metal complex in an organic optoelectronic device, and the organic optoelectronic device includes organic light-emitting devices (OLEDs), organic thin film transistors (OTFTs), organic photovoltaics (OPVs), luminescent electrochemical cells (LECs) and chemical sensors, preferably, OLEDs.

Provided is an organic light-emitting device (OLEDs) containing the above platinum metal complex; and the complex serves as a light-emitting material in a light-emitting device.

The organic light-emitting device of the present invention includes a cathode, an anode, and an organic layer, where the organic layer is one or more of a hole injection layer, a hole transport layer, a light-emitting layer, a hole blocking layer, an electron injection layer and an electron transport layer; and it is unnecessary to provide each of these organic layers.

At least one of the hole injection layer, the hole transport layer, the hole blocking layer, the light-emitting layer and/or the electron transport layer contains the compound of Formula (I).

Preferably, the compound of structural formula (1) is located at the light-emitting layer or the electron transport layer.

The device of the present invention has a total thickness of organic layers of 1-1000 nm, preferably, 1-500 nm, more preferably, 5-300 nm.

The organic layers may form a film via evaporation or a solution method.

The present invention mainly has the following beneficial effects: (1) the platinum metal complex of the present invention is applied in OLED devices to have good luminous efficiency and service life of a device; (2) when the conventional light-emitting molecules are in the state of aggregation, stronger intermolecular interaction leads to reduced luminescence quantum yield; while the platinum metal complex of the present invention has a stronger three-dimensional space configuration, and has the property of aggregation-induced emission enhancement in the state of aggregation, thus being beneficial to improving the luminous efficiency of a device.

BRIEF DESCRIPTION OF DRAWINGS

FIG. 1 is a structure diagram showing an organic light-emitting device of the present invention;
10 represents glass substrate; 20 represents anode; 30 represents hole injection layer; 40 represents hole transport layer; 50 represents light-emitting layer; 60 represents electron transport layer; 70 represents electron injection layer; 80 represents cathode.

DETAILED DESCRIPTION OF EMBODIMENTS

The synthesis method of the material is not required in this present invention. To describe the present invention more specifically, examples are set forth below, but not limited thereto.

Raw materials used in the following synthesis are products available commercially.

Example 1

Synthesis of the Complex 1

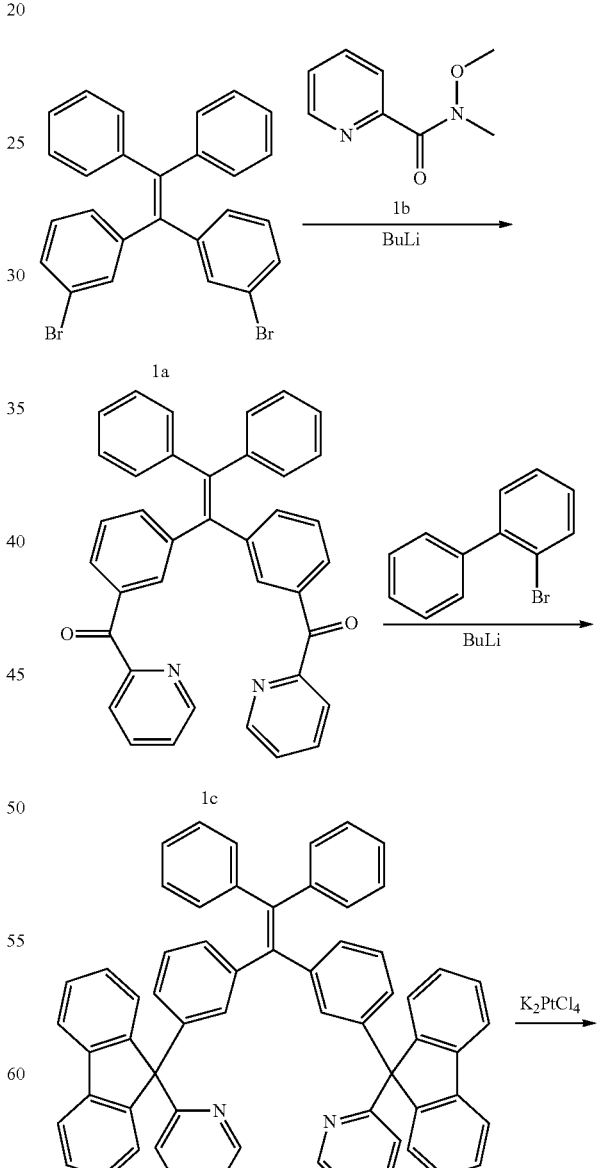

-continued

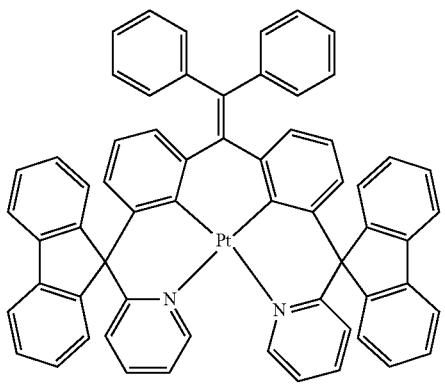

1 water, then extracted for three times with dichloromethane; organic phases were combined. The organic phase was dried by anhydrous sodium sulfate and subjected to rotary evaporation to remove solvent; the residue was separated by column chromatography to obtain a light yellow solid (2.8 g, yield: 71%). ESI-MS (m/z): 815.3 (M+1).

Synthesis of the Complex 1

The compound 1d (2.5 g, 3.1 mmol), potassium tetrachloroplatinate (1.5 g, 3.6 mmol) and 250 mL acetic acid were added to a flask and stirred for 48 h at reflux under the protection of nitrogen. The above reaction liquid was cooled to room temperature, then added to water and filtered to obtain a coarse product, and the coarse product was recrystallized to obtain a yellow solid (2.5 g, yield: 80%). ESI-MS (m/z): 1008.3 (M+1).

Example 2

Synthesis of the Complex 22

Synthesis of the Intermediate 1c

The compound 1a (4.9 g, 10.0 mmol) (Reference: J. Mater. Chem., 2014, 2, 2028 synthesis) was dissolved into tetrahydrofuran (50 mL) under the protection of nitrogen, and cooled to −78° C., then dropwisely added with n-butyllithium BuLi (2.0 M, 11 mL), and stirred for 30 min, afterwards, a tetrahydrofuran solution of the compound 1b (4.2 g, 25.0 mmol) (Reference: J. Am. Chem. Soc, 2008, 130, 9942 synthesis) was dropwisely added to the above solution, stirred for 30 min, and heated up to room temperature, and stirred for 1 h continuously. The above reaction liquid was added to a diluted hydrochloric acid solution (1 M, 100 mL), and stirred for 30 min. The mixture was extracted for three times with dichloromethane; organic phases were combined. The organic phase was dried by anhydrous sodium sulfate and subjected to rotary evaporation to remove solvent, thus obtaining a light yellow solid; the residue was separated by column chromatography to obtain a light yellow oily matter (2.8 g, yield: 51%). ESI-MS (m/z): 543.2 (M+1).

Synthesis of the Compound 1d 2-bromobiphenyl (2.3 g, 10.0 mmol) was dissolved into tetrahydrofuran (30 mL) under the protection of nitrogen, and cooled to −78° C., then dropwisely added with n-butyllithium BuLi (2.0 M, 11 mL), and stirred for 30 min, afterwards, the tetrahydrofuran solution (10 mL) of the compound 1c (2.6 g, 4.8 mmol) was dropwisely added to the above solution, stirred for 30 min, and heated up to room temperature, and stirred for 1 h continuously. The above reaction liquid was added to water and then extracted for three times with dichloromethane; organic phases were combined. The organic phase was dried by anhydrous sodium sulfate and subjected to rotary evaporation to remove solvent, thus obtaining a light yellow solid. The above solid was dissolved into acetic acid (50 mL), and added with concentrated sulfuric acid (4 mL) for reflux over the night under the protection of nitrogen. The above reaction liquid was cooled to room temperature and added to

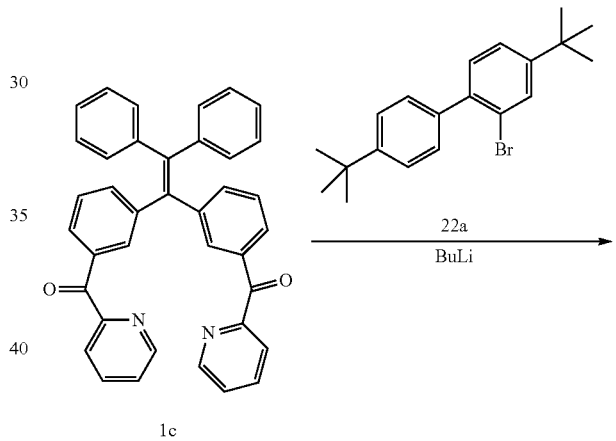

1c

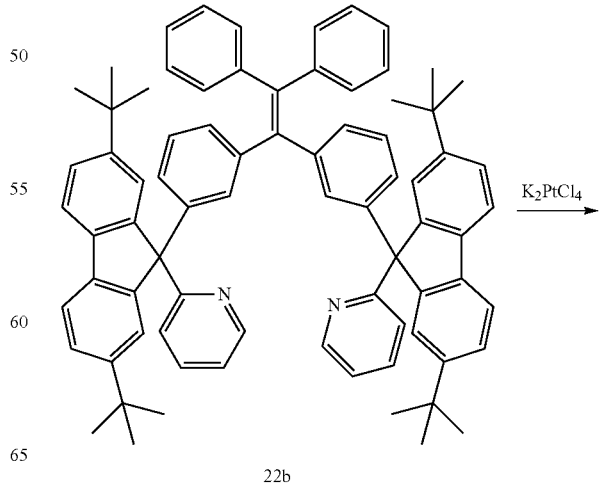

22b

-continued

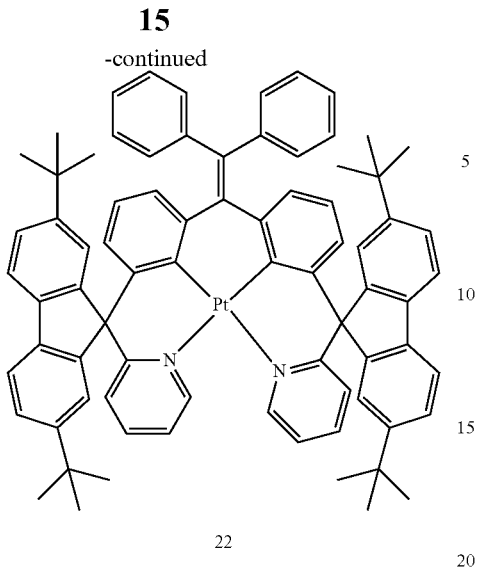

22

Synthesis of the Intermediate 22b

The 2-bromobiphenyl was replaced with the compound 22a (Reference: Dyes Pigm., 2015, 121, 7 synthesis) to synthesize the intermediate 22b by reference to the preparation method of the compound 1d, thus obtaining 2.9 g of a light yellow solid with a yield of 69%. ESI-MS (m/z): 1039.6 (M+1).

Synthesis of the Complex 22

1d was replaced with the compound 22b to synthesize the complex 22 by reference to the preparation method of the complex 1, thus obtaining 2.1 g of a yellow solid with a yield of 73%. ESI-MS (m/z): 1232.5 (M+1).

Example 3

A light-emitting device was prepared by using the complex light-emitting material of the present invention, and the device has a structure shown in FIG. 1.

Firstly, a transparent conductive ITO glass substrate 10 (an anode was provided) was successively cleaned with a detergent solution and deionized water, ethanol, acetone, and deionized water, and then subjected to plasma treatment with oxygen for 30 s.

HATCN having a thickness of 10 nm was then evaporated on the ITO as a hole injection layer 30.

A compound HT was then evaporated to form a hole transport layer 40 having a thickness of 40 nm.

A light-emitting layer 50 having a thickness of 20 nm was then evaporated on the hole transport layer; the light-emitting layer was obtained by mixing and doping the complex 1 (20%) with CBP (80%).

AlQ$_3$ having a thickness of 40 nm was evaporated on the light-emitting layer as an electron transport layer 60.

Finally, 1 nm LiF was evaporated as an electron injection layer 70 and 100 nm Al was evaporated as a cathode 80 of the device.

Example 4

The complex 1 was replaced with the complex 22; a light-emitting device was prepared according to the method described in Example 3.

COMPARATIVE EXAMPLE

The complex 1 was replaced with Ir(PPy)$_3$; a light-emitting device was prepared according to the method described in Example 3.

HATCN, HT, AlQ$_3$, Ir(PPy)$_3$ and CBP in the device have the following structural formulas:

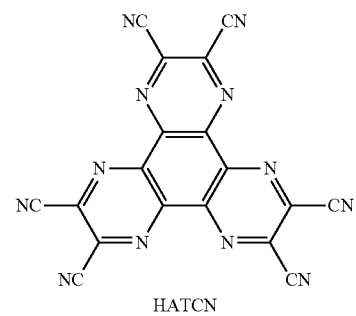

HATCN

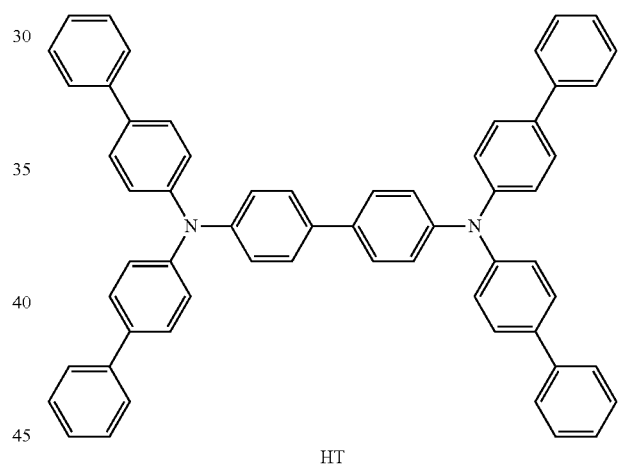

HT

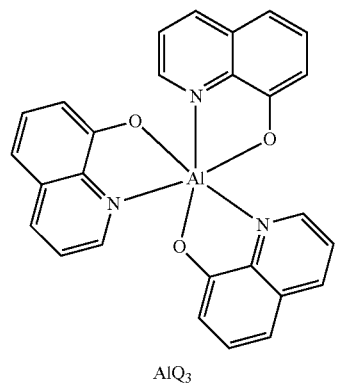

AlQ$_3$

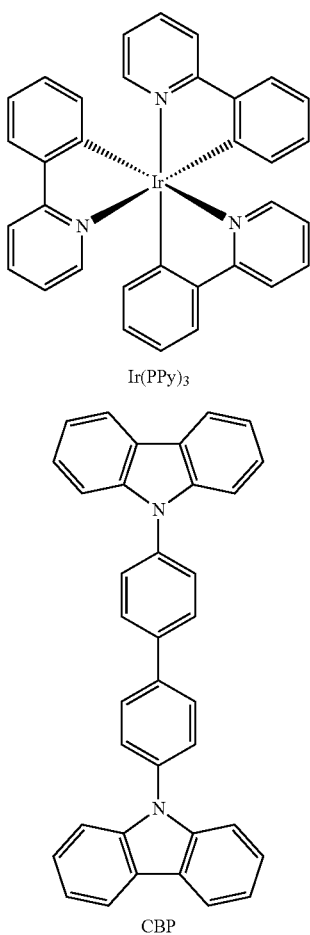

Ir(PPy)₃

CBP

Performance of the organic light-emitting devices in Examples 3-4 and Comparative Example at an electric current density of 10 mA/cm² is listed in Table 1:

TABLE 1

| Example | Complex | Driving voltage | Luminous efficiency | Device service life (LT95) |
|---|---|---|---|---|
| 3 | 1 | 0.91 | 1.2 | 1.5 |
| 4 | 22 | 0.87 | 1.3 | 1.3 |
| Comparative Example | Ir(PPy)₃ | 1 | 1 | 1 |

Remarks:
the performance test of the device is by reference to the Comparative Example; each index in the Comparative Example is set 1; LT95 shows the corresponding time when the device brightness attenuates to 95% of the initial brightness.

It can be seen from the data of Table 1 that under the same conditions, the efficiency of the organic light-emitting device prepared by the compound of the present invention is superior to that of the Comparative Example; compared with the common complex light-emitting material Ir(PPy)₃, the platinum metal complex material of the present invention is applied in an organic light-emitting device to have a lower driving voltage and a higher luminous efficiency. Moreover, the service life of the device is also improved to some extent, which conforms to the demands of the display industry for light-emitting materials. Therefore, the present invention has good industrialization prospect.

Example 5

Ratio ($\Phi_a/\Phi_b$) of luminescence quantum yields of the platinum complexes 1 and 22 in the state of aggregation and solution is listed in Table 2:

TABLE 2

| Complex | 2 | 22 |
|---|---|---|
| $\Phi_a/\Phi_b$ | 2.1 | 2.5 |

$\Phi_a$: the luminescence quantum yield of the complex in the state of aggregation;
$\Phi_b$: the luminescence quantum yield of the platinum complex in dichloromethane solution ($1 \times 10^{-5}$ M).

It can be seen from the data of Table 2 that the quantum yield of the platinum metal complex of the present invention in the state of aggregation is higher than that in solution. As can be seen, the platinum metal complex of the present invention further has the property of aggregation-induced emission enhancement.

The above multiple embodiments are merely set as examples, but are not construed as limiting the protection scope of the present invention. Multiple materials and structures of the present invention may be replaced by other materials and structures in the premise of not departing from the spirit of the present invention. It should be understood that a person skilled in the art can make lots of modifications and changes according to the idea of the present invention without inventive efforts. Therefore, any technical solution obtained by a person skilled in the art on the basis of the prior art and through analysis, reasoning or partial researches shall fall within the protection scope defined in the claims.

The invention claimed is:

1. A platinum metal complex, being a compound having a structure as shown in Formula (I):

(Formula I)

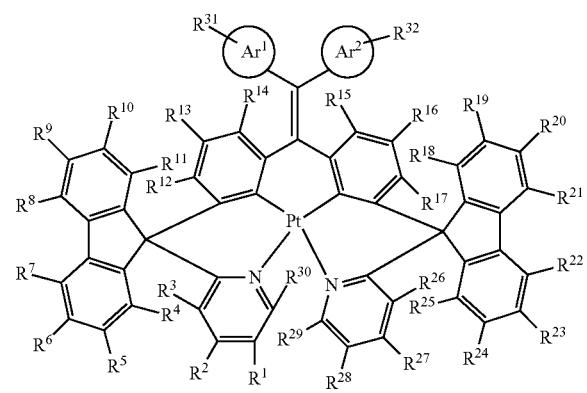

wherein:
  $R^1$-$R^{32}$ are each independently selected from:
    hydrogen,
    deuterium,
    halogen,
    substituted or unsubstituted alkyl having 1-20 carbon atoms, substituted or unsubstituted cycloalkyl having 3-20 carbon atoms, substituted or unsubstituted alkoxy having 1-20 carbon atoms, substituted or unsubstituted aryl having 6-30 carbon atoms, substituted or unsubstituted heteroaryl having 3-30 carbon atoms, and cyano;

$Ar^1$ and $Ar^2$ are independently selected from an aromatic group having 6-14 carbon atoms and an heteroaromatic group having 3-12 carbon atoms, respectively;

heteroatom in the heteroaromatic group is selected from one or more of O, S and N; and the substitution is chosen from the group consisting of substitution by deuterium, halogen and C1-8 alkyl.

2. The platinum metal complex according to claim 1, wherein;

the $R^1$-$R^{32}$ are independently selected from:

hydrogen, deuterium, halogen, substituted or unsubstituted alkyl having 1-6 carbon atoms, substituted or unsubstituted cycloalkyl having 3-6 carbon atoms, substituted or unsubstituted aryl having 6-12 carbon atoms, and substituted or unsubstituted heteroaryl having 3-6 carbon atoms, respectively; and the $Ar^1$ and the $Ar^2$ are independently selected from phenyl and pyridine, respectively.

3. The platinum metal complex according to claim 2, wherein:

the $R^1$-$R^{32}$ are independently selected from:

hydrogen, deuterium, substituted or unsubstituted alkyl having 1-4 carbon atoms, and substituted or unsubstituted cycloalkyl having 3-6 carbon atoms, phenyl, tolyl or pyridyl, respectively; and the $Ar^1$ and the $Ar^2$ are the same.

4. The platinum metal complex according to claim 3, wherein the $R^1$-$R^{32}$ are independently selected, respectively, from:

hydrogen, methyl, isopropyl, and tert-butyl.

5. The platinum metal complex according to claim 4, wherein;

$R^1$-$R^3$, $R^{12}$-$R^{17}$ and $R^{26}$-$R^{30}$ in the $R^1$-$R^{32}$ are hydrogen;

the remaining R groups are selected from the group consisting of hydrogen, methyl, isopropyl or tert-butyl; and the $Ar^1$ and the $Ar^2$ are phenyl.

6. The platinum metal complex according to claim 1, which is one of the following compounds:

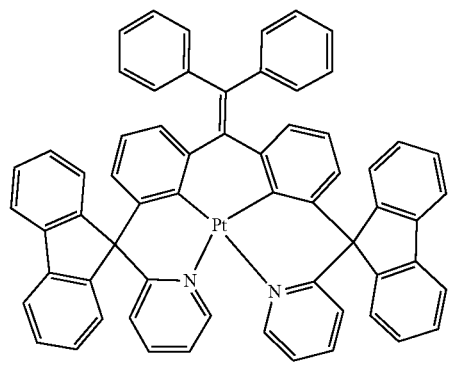

1

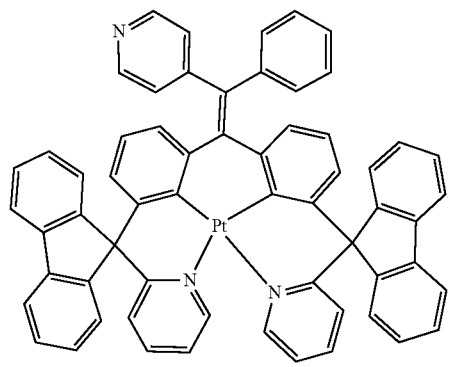

2

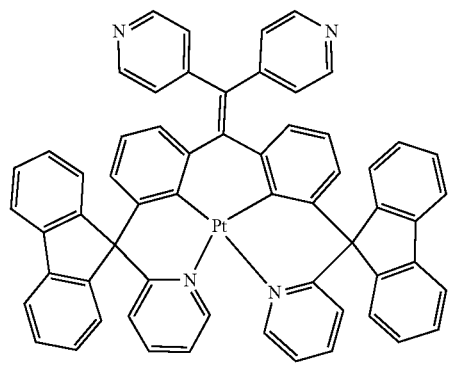

3

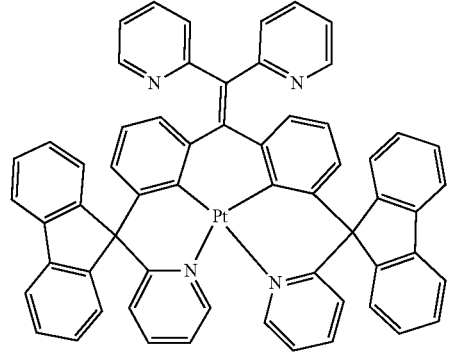

4

5
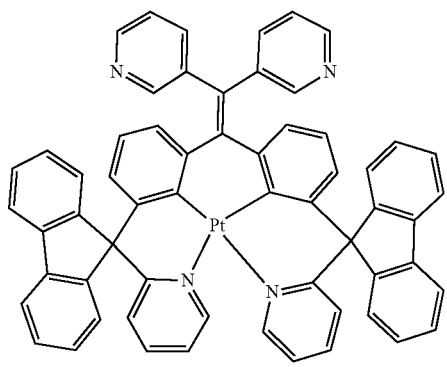
6
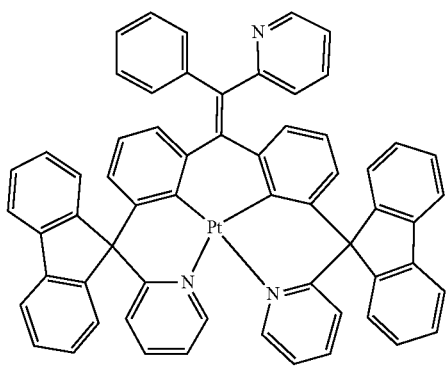
7
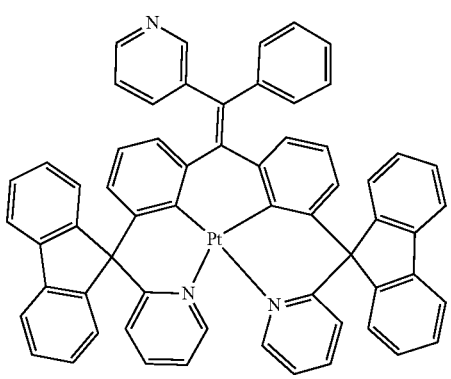
8
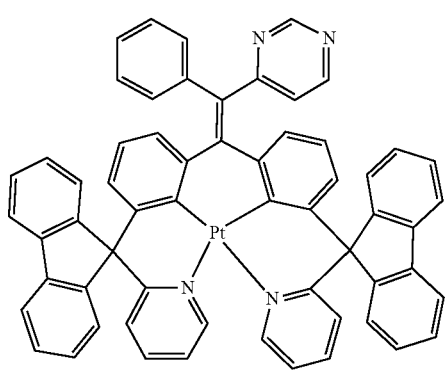
9
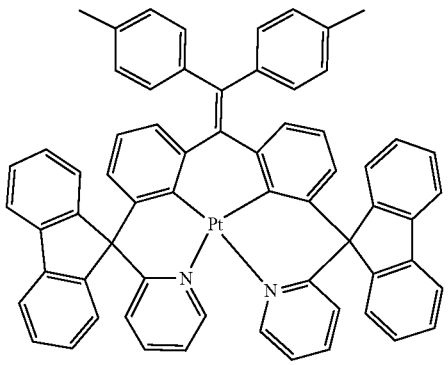
10
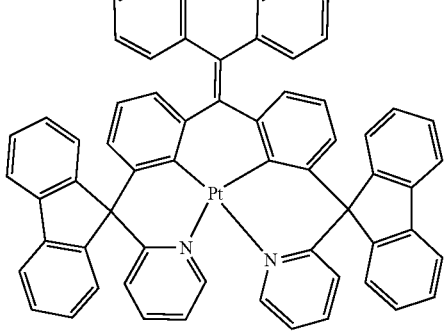
11
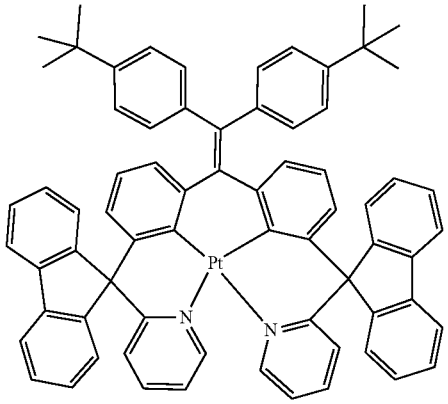
12
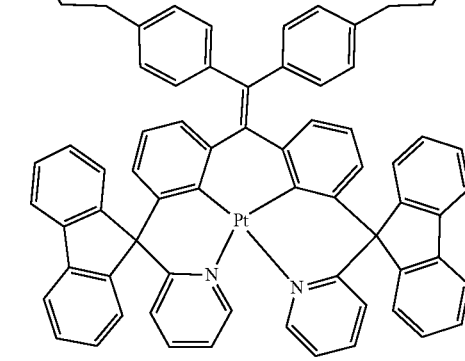

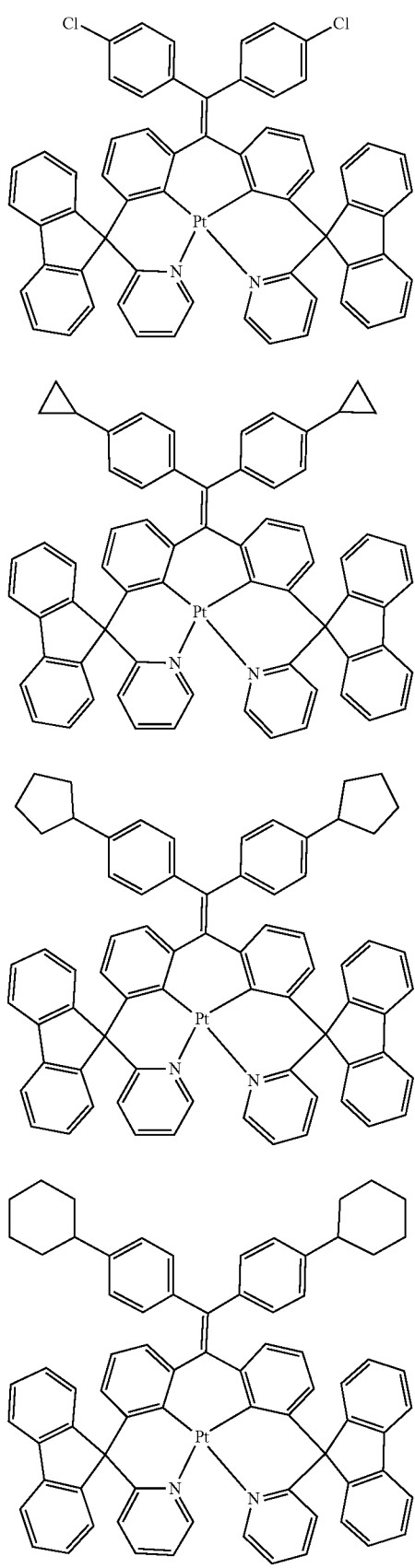
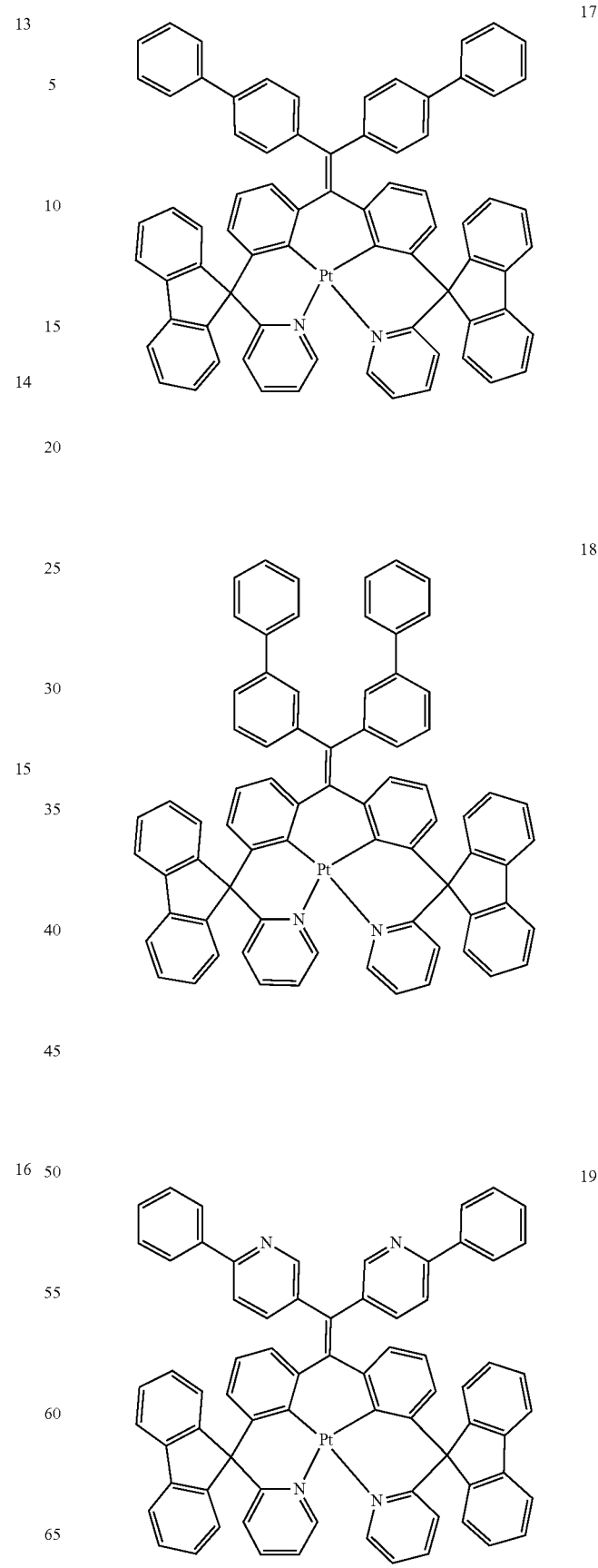

20
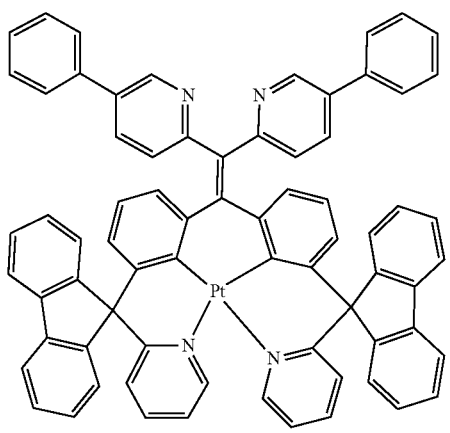
21
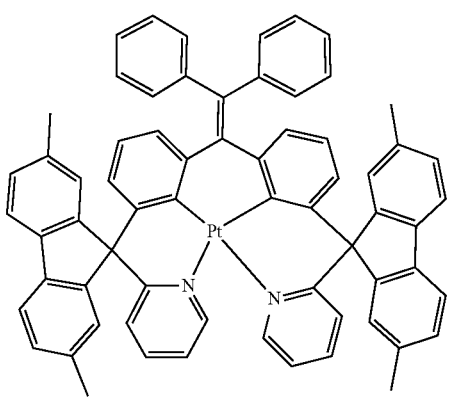
22
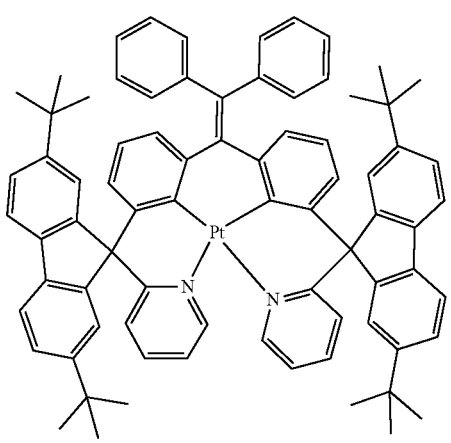
23
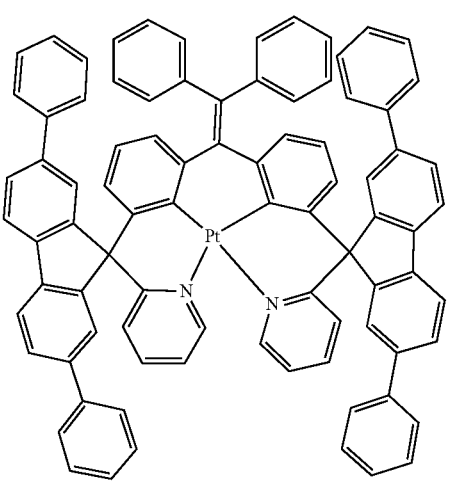
24
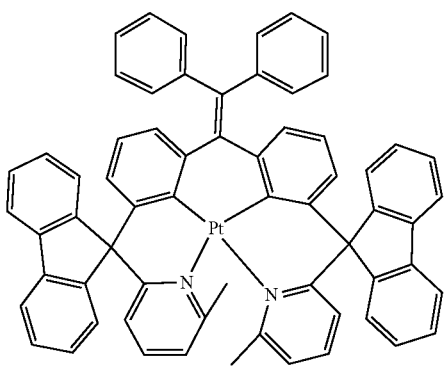
25
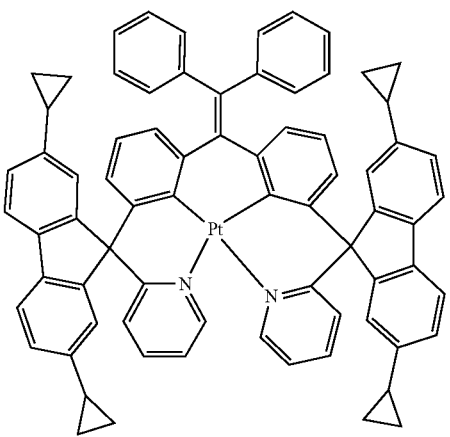

-continued

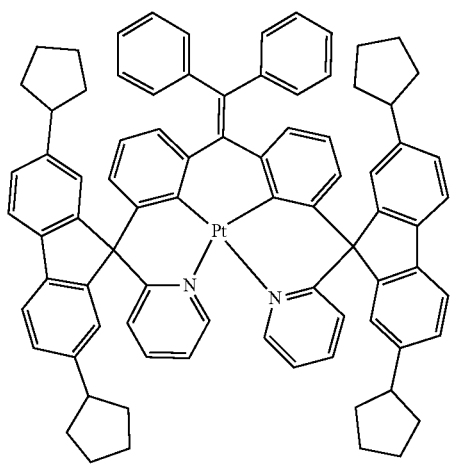

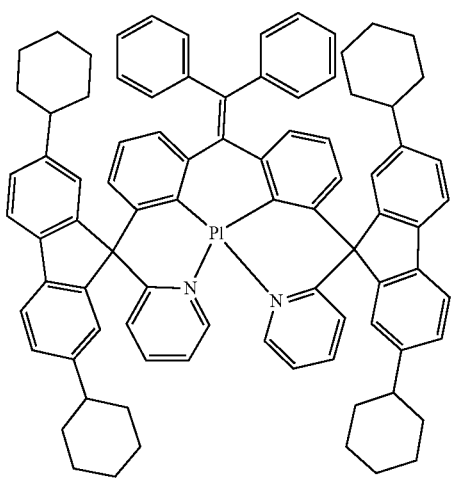

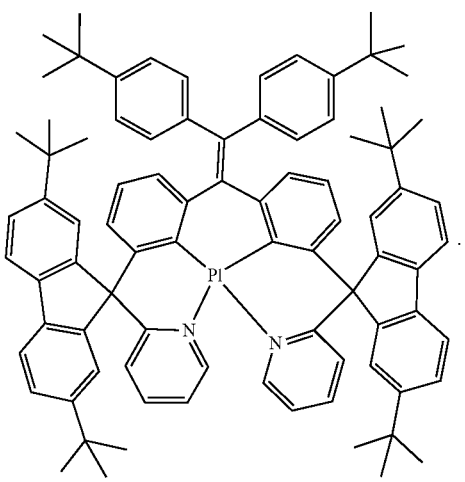

7. The platinum metal complex according to claim 6, having one of the following structures:

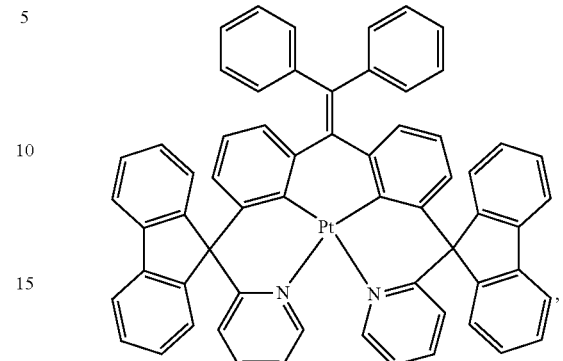

and

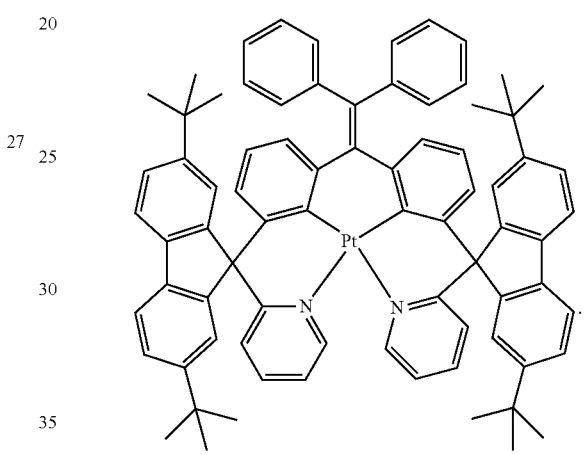

8. A precursor of the platinum metal complex according to claim 1, namely, a ligand, having the following structural formula:

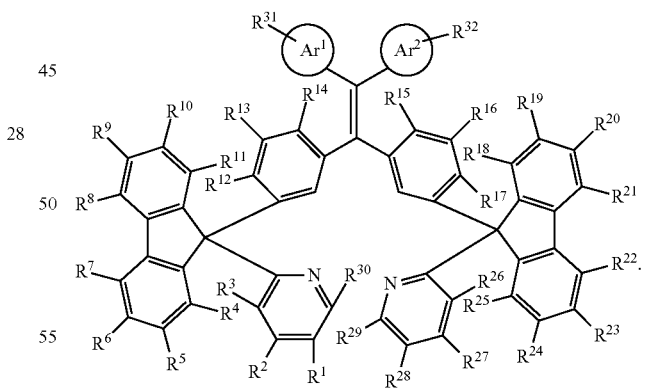

9. An organic light-emitting device comprising the platinum metal complex according to claim 1 that is an organic thin film transistor, an organic photovoltaic device, a luminescent electrochemical cell, or a chemical sensor.

10. An organic light-emitting device, comprising:
a cathode,
an anode, and
an organic layer, wherein;
the organic layer is one or more of a hole injection layer, a hole transport layer, a light-emitting layer, a hole blocking layer, an electron injection layer and an electron transport layer; and
the organic layer includes the platinum metal complex according to claim 1.

11. The organic light-emitting device according to claim 10, wherein the platinum metal complex is located at the light-emitting layer.

12. The organic light-emitting device according to claim 10, wherein:
the organic layer has a total thickness of 1-1000 nm; and
the organic layer forms a thin film via evaporation or a solution method.

13. A precursor of the platinum metal complex according to claim 2, namely, a ligand, having the following structural formula:

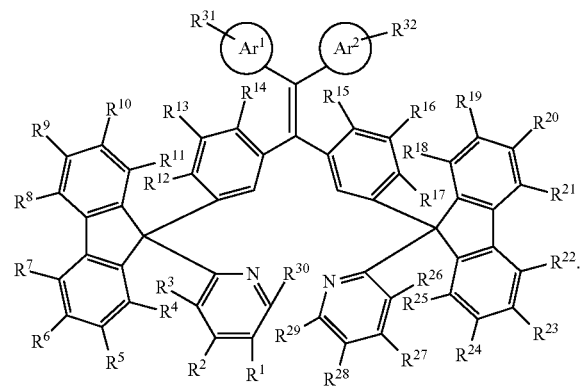

14. An organic light-emitting device comprising the platinum metal complex according to claim 2 that is an organic thin film transistor, an organic photovoltaic device, a luminescent electrochemical cell, or a chemical sensor.

15. An organic light-emitting device, comprising:
a cathode,
an anode, and
an organic layer,
wherein:
the organic layer is one or more of a hole injection layer, a hole transport layer, a light-emitting layer, a hole blocking layer, an electron injection layer and an electron transport layer; and
the organic layer includes the platinum metal complex according to claim 2.

16. The organic light-emitting device according to claim 15, wherein the platinum metal complex is located at the light-emitting layer.

17. A precursor of the platinum metal complex according to claim 6, namely, a ligand, having the following structural formula:

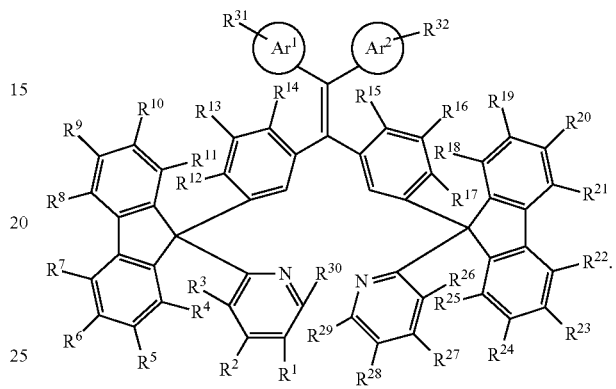

18. An organic light-emitting device comprising the platinum metal complex according to claim 6 that is an organic thin film transistor, an organic photovoltaic device, a luminescent electrochemical cell, or a chemical sensor.

19. An organic light-emitting device, comprising:
a cathode,
an anode, and
an organic layer,
wherein:
the organic layer is one or more of a hole injection layer, a hole transport layer, a light-emitting layer, a hole blocking layer, an electron injection layer and an electron transport layer; and
the organic layer includes the platinum metal complex according to claim 6.

20. The organic light-emitting device according to claim 19, wherein the platinum metal complex is located at the light-emitting layer.

* * * * *